United States Patent [19]

Tomita et al.

[11] Patent Number: 6,009,828
[45] Date of Patent: Jan. 4, 2000

[54] METHOD FOR FORMING A THIN SEMICONDUCTOR FILM AND A PLASMA CVD APPARATUS TO BE USED IN THE METHOD

[75] Inventors: Takashi Tomita, Nara; Katsuhiko Nomoto, Kashiwara; Yoshihiro Yamamoto, Nara; Hitoshi Sannomiya, Osaka; Sae Takagi, Tondabayashi, all of Japan

[73] Assignee: Sharp Kabushiki Kaisha, Osaka, Japan

[21] Appl. No.: 08/783,283

[22] Filed: Jan. 10, 1997

Related U.S. Application Data

[62] Division of application No. 08/601,990, Feb. 15, 1996, Pat. No. 5,618,758.

[30] Foreign Application Priority Data

| Feb. 17, 1995 | [JP] | Japan | 7-29086 |
| Feb. 17, 1995 | [JP] | Japan | 7-29087 |
| Dec. 26, 1995 | [JP] | Japan | 7-339696 |

[51] Int. Cl.$^7$ .................................................. C23C 16/00
[52] U.S. Cl. .................................. 118/723 E; 118/723 R; 156/345
[58] Field of Search ............................ 118/723 R, 723 E; 156/345; 204/298.34

[56] References Cited

U.S. PATENT DOCUMENTS

| 4,808,258 | 2/1989 | Otsubo et al. | 156/643 |
| 4,863,549 | 9/1989 | Grünwald | 156/345 |
| 5,057,185 | 10/1991 | Thomas, III et al. | 156/643 |
| 5,093,703 | 3/1992 | Minami et al. | |
| 5,160,397 | 11/1992 | Doki et al. | 156/345 |
| 5,324,388 | 6/1994 | Yamano et al. | 156/643 |
| 5,405,448 | 4/1995 | Jost et al. | |
| 5,455,061 | 10/1995 | Matossian et al. | 427/8 |
| 5,468,341 | 11/1995 | Samukawa | 216/69 |
| 5,487,786 | 1/1996 | Chida et al. | |

FOREIGN PATENT DOCUMENTS

| 0 533 044 A1 | 3/1993 | European Pat. Off. |
| 2708624 | 2/1995 | France |
| 5-156453 | 6/1993 | Japan |
| 5-335244 | 12/1993 | Japan |

OTHER PUBLICATIONS

T. Yoshida et al, "Film Deposition Process in Pulse Discharge CVD", Amorphous Silicon Technology, MRS Symposium Proceedings, vol. 219, Apr. 30, 1991 —May 3 1991, pp. 655–665 (XP–002077932).

*Appl. Phys. Lett.*, vol. 53, No. 14, pp. 1263–1265, 1988, "Effects of low–frequency modulation on rf discharge chemical vapor depositon".

*Appl. Phys. Lett.*, vol.57, No. 16, pp. 1616–1618, 1990, "Powder–free plasma chemical vapor deposition of hydrogenated amorphous silicon with high rf power density using modulated rf discharge".

*Applied Physics*, vol. 62, No. 7, pp. 699–702, 1993, "Formation of powder in rf silane plasmas and its growth suppression".

*Primary Examiner*—R. Bruce Breneman
*Assistant Examiner*—Luz Alejandro
*Attorney, Agent, or Firm*—Nixon & Vanderhye P.C.

[57] ABSTRACT

A method for producing a thin semiconductor film according to the present invention includes the steps of: placing a group-IV compound or a derivative thereof in a plasma state; decomposing the group-IV compound or the derivative thereof into active species; and depositing the active species on a substrate, wherein energy for generating plasma is intermittently supplied at a supply time interval which is equal to or less than a reciprocal of {(secondary reaction rate constant of a source gas reacting with active species other than long-life active species within the plasma)×(number of source gas molecules)}.

6 Claims, 5 Drawing Sheets

METHOD FOR FORMING A THIN SEMICONDUCTOR FILM AND A PLASMA CVD APPARATUS TO BE USED IN THE METHOD

This is a division of application Ser. No. 08/601,990, filed Feb. 15, 1996 now U.S. Pat. No. 5,618,758.

BACKGROUND OF THE INVENTION

1. Field of the Invention

The present invention relates to a method of producing a thin semiconductor film for use in the field of electronics, and a plasma CVD (Chemical Vapor Deposition) apparatus to be used for producing the same. In particular, the present invention relates to a method of producing a thin semiconductor film suitably used for optical semiconductor devices such as solar batteries, and a plasma CVD apparatus to be used for producing the same.

2. Description of the Related Art

Today, methods for producing thin films from a vapor by utilizing plasma are applied to various fields, e.g., metal films, semiconductor films, and dielectric films. In particular, plasma CVD devices are employed to place a group-IV hydrogen compound into a plasma state, thereby decomposing the group-IV compound into active species, which are deposited on a substrate. Vigorous research activity has been conducted on hydrogenated amorphous silicon type thin films formed by this method, such as hydrogenated amorphous silicon (a-Si: H), hydrogenated amorphous silicon carbon (a-SiC: H), and hydrogenated amorphous silicon germanium (a-SiGe: H)), since its PN controlling properties (which is one of the most important properties of semiconductor materials) were reported. Such thin semiconductor films have been employed in practical applications such as solar batteries for consumer use (e.g., those for calculators), the core sections of liquid crystal display devices, photosensitive drums, and various sensors, and the like.

In order to further broaden the application range of devices incorporating such thin semiconductor films and to expand the market thereof, it is desired to find a method for rapidly forming a high-quality film with a high yield. In the case of amorphous solar batteries incorporating hydrogenated amorphous silicon type thin films, for example, they are desired to be employed in solar-battery power supply applications, as well as the above-mentioned consumer use, e.g., calculators. In order for such applications to be practical, however, the production cost of the thin semiconductor films must be minimized for possible competition with existing commercial power supplies.

According to a cost analysis by the present inventors, in order to sufficiently reduce the production cost of hydrogenated amorphous silicon type thin films for competition with existing commercial power supplies, the film formation rate of hydrogenated amorphous silicon type thin films must be enhanced by one digit (e.g., 600 angstroms/min) from the currently available rate. Furthermore, capability of depositing high-quality films with a high yield is required.

However, although the plasma CVD method can achieve a higher-rate film formation by supplying a larger high-frequency power and/or supplying a larger amount of material gas, if semiconductor films were formed at a high rate, e.g., 300 angstroms/min, by such a method, a large amount of polysilane powder would be generated, thereby resulting in a low yield. (Hereinafter, this method will be referred to as "conventional plasma CVD method 1").

Figure 1A:
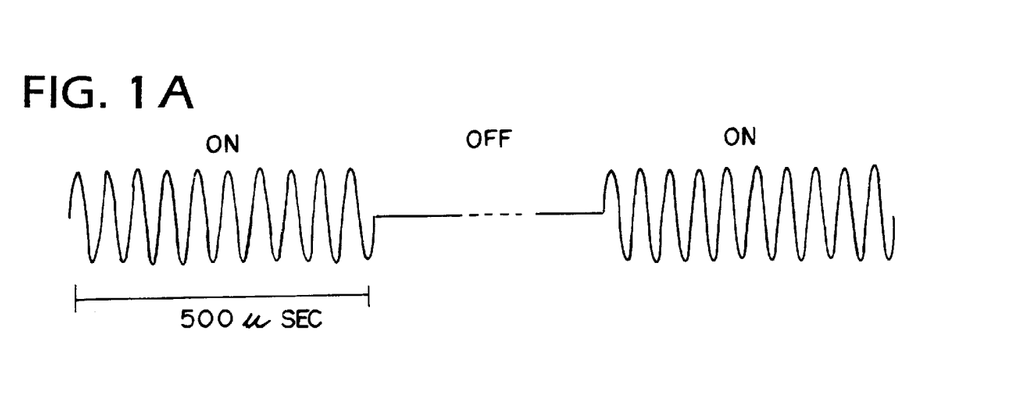
FIG. 1A is a schematic diagram showing a conventional modulated high frequency power obtained by periodically switching on and off high frequency power.

On the other hand, there has been proposed a method for rapidly forming a-Si: H films utilizing a plasma CVD method which can solve the above-mentioned problem of powder generation (Apply. Phys. Lett. 53(1988)1263, Appl. Phys. Lett. 57(1990)1616, and Applied Physics, vol. 52, No. 7(1993)699). This plasma CVD method employs a modulated high frequency power supply as an excitation power supply which repeats a periodical switching on and off, as shown in FIG. 1A, in which a high frequency generation circuit and an oscillation circuit which repeats a periodical switching on and off are combined. (Hereinafter, this method will be referred to as "conventional plasma CVD method 2").

Conventional plasma CVD method 2 is known to remarkably reduce polysilane powder generation within the reaction apparatus (as compared with conventional plasma CVD method 1) when depositing an a-Si: H film under the following conditions: a periodic on-off frequency of approximately 1 kHz; a duty ratio of approximately 50% (which provides an ON period of 500 $\mu$sec); a film formation rate of approximately 300 angstroms/min to 600 angstroms/min. If any undesirable powder deposited in the reaction apparatus is attached to a substrate, more frequent maintenance activities for the apparatus will be required, and the production yield will decrease. In this regard, conventional plasma CVD method 2 is recognized to increase the throughput of the production line and the production yield by reducing the amount of powder generated in high-rate film formation.

However, it had not been specifically examined whether or not a thin film formed by conventional plasma CVD method 2 (described above) is suitable as a thin semiconductor film for photosemiconductor devices such as solar batteries.

SUMMARY OF THE INVENTION

A method for producing a thin semiconductor film according to the present invention includes the steps of: placing a group-IV compound or a derivative thereof in a plasma state; decomposing the group-IV compound or the derivative thereof into active species; and depositing the active species on a substrate, wherein energy for generating plasma is intermittently supplied at a supply time interval which is equal to or less than a reciprocal of ((secondary reaction rate constant of a source gas reacting with active species other than long-life active species within the plasma)×(number of source gas molecules)).

In one embodiment of the method for producing a thin semiconductor film of the invention, the thin semi-conductor film is deposited at a rate of 300 angstroms/min or more, and the energy for plasma generation is intermittently supplied at a supply time interval of 50 $\mu$sec or less.

In another embodiment of the method for producing a thin semiconductor film of the invention, the thin semiconductor film is a hydrogenated amorphous silicon type thin film, and a content ratio of Si—$H_2$ bonds to Si—H bonds is smaller than 0.5.

In still another embodiment of the method for producing a thin semiconductor film of the invention, a high frequency power of 27.12 MHz or more is intermittently supplied as the energy for plasma generation.

In still another embodiment of the method for producing a thin semiconductor film of the invention, a high frequency power of 27.12 MHz or more is intermittently supplied as the energy for plasma generation at a supply time interval of 50 $\mu$sec or less.

A plasma CVD apparatus to be used In a method for producing a thin semiconductor film according to the present invention includes a high frequency power supply for supplying energy for generating plasma and a modulation power supply for allowing or inhibiting the supplying of the energy in a time-divided manner, wherein the energy for generating the plasma is intermittently supplied at a supply time interval which is equal to or lees than a reciprocal of ((secondary reaction rate constant of a source gas reacting with active species other than long-life active species within the plasma)×(number of source gas molecules)).

In one embodiment of the plasma CVD apparatus of the invention, the thin semiconductor film is deposited at a rate of 300 angstroms/min or more, and the energy for plasma generation is intermittently supplied at a supply time interval of 50 $\mu$sec or less, In another embodiment of the plasma CVD apparatus of the invention, the thin semiconductor film is a hydrogenated amorphous silicon type thin film, and a content ratio of Si—$H_2$ bonds to Si—H bonds is smaller than 0.5.

In still another embodiment of the plasma CVD apparatus of the invention, the energy for plasma generation is 27.12 MHz or more.

According to the present example, a thin semi-conductor film is formed under the same conditions as in the above-mentioned conventional plasma CVD method 2 except that an ON time during which power for plasma generation is supplied is prescribed to be a very small value, e.g., $\frac{1}{10}$ or less of a typical ON time adopted in a conventional plasma CVD method 2. As a result, the content ratio of Si—$H_2$ bonds to Si—H bonds is reduced, whereby a thin semiconductor film having an excellent photoconductivity end an excellent photoconductivity/dark conductivity ratio can be obtained. Specifically, the ON time of the power supply is prescribed to be 50 $\mu$sec or less according to the present invention, in order to reduce the content ratio of Si—$H_2$ bonds to Si—H bonds.

The reason for the reduction of the content ratio of Si—$H_2$ bonds to Si—H bonds is presumed to be because the generation of cluster molecules in a secondary reaction of active species such as SiH and $SiH_2$ in the plasma is prevented. Such cluster molecules are presumed to be generated within a lapse of time on the order of a reciprocal of {(secondary reaction rate constant of a source gas (i.e., $SiH_4$ in this exemplary case) reacting with active species (i.e., $SiH_2$ and the like in this exemplary case) other than long-life active species (i.e., $SiH_3$ in this exemplary case) within the plasma)×(number of source gas molecules)}, which formula was logically deduced by the present inventors. Therefore, in order to prevent the generation of cluster molecules, energy for plasma generation is supplied in an intermittent manner, i.e., at this time interval, according to the present invention.

Furthermore, by adopting a high frequency plasma at 27.12 MHz or more, the efficiency of gas decomposition can be improved. Therefore, the deposition rate can be increased relative to the case of adopting a plasma of 13.56 MHz (conventional) with the same power supplied. The use of a high frequency plasma at 27.12 MHz or more also results in a lower plasma potential than in the case of 13.56 MHz, thereby preventing the resultant film from being damaged by ion species. As a result, the quality of the film can be improved. For these reasons, according to the present invention, a high frequency power of 27.12 MHz or more is employed as a plasma source, which is intermittently supplied for plasma generation. As a result, films with higher quality can be formed with an even higher rate.

Thus, the invention described herein makes possible the advantages of (1) providing a method for rapidly forming a high-quality thin semiconductor film suitably used for photosemiconductor devices, e.g., solar batteries, while minimizing the generation of polysilane; and (2) providing a plasma CVD apparatus used for the method.

These and other advantages of the present invention will become apparent to those skilled in the art upon reading and understanding the following detailed description with reference to the accompanying figures.

DESCRIPTION OF THE PREFERRED EMBODIMENTS

The inventors of the present invention analyzed the film structure of an a-Si: H film obtained by a conventional plasma CVD method 2 on the basis of the infrared absorption spectrum data thereof. As a result of our analysis, it was revealed that the a-Si: H film is different in quality from a high-quality a-Si: H film which was deposited at a usual rate of about 60 angstroms/min. Specifically, the high-quality a-Si: H film (deposited at the usual rate of 60 angstroms/min) is advantageously dominated by Si—H bonds in the vicinity of 2000 $cm^{-1}$, while the a-Si: H film obtained through a high-rate film formation by conventional plasma CVD method 2 includes Si—$H_2$ bonds in the vicinity of 2090 $cm^{-1}$ as frequently as Si—H bonds. The Si—$H_2$ bonds contained in the a-Si: H film disadvantageously lower the photoconductivity of the semiconductor film and the ratio of photoconductivity to dark conductivity (i.e., photoconductivity/dar conductivity), thus deteriorating the performance of photosemiconductor devices icorporating such a semiconductor film. In other words, although the conventional plasma CVD method 2 is capable of forming an a-Si: H film at a high rate while minimizing the powder generation within the reaction apparatus, the resultant a-Si: H film has the problems of low photoconductivity and low ratio of photoconductivity to dark conductivity owing to an undesirable change in its film structure. Such an a-Si: H film cannot be suitably used as a thin semiconductor film for photosemiconductor devices such as solar batteries.

In order to solve the above-mentioned problems, the present invention provides a method for rapidly forming a high-quality thin semiconductor film suitably used for photosemiconductor devices, e.g., solar batteries, while minimizing the generation of polysilane. The present invention also provides a plasma CVD apparatus used for the method, as specifically described in the following examples.

EXAMPLE 1

Hereinafter, Example 1 of the present invention will be described.

In the present example, monosilane is used as a group-IV hydrogen compound material gas In order to form an a-Si: H film, which is a thin semiconductor film for use in solar batteries. As the material gas, $SiH_2F_2$, $SiHF_3$, or $SiH_2Cl_2$, can be used instead of monosilane; these compounds are derivatives of group-IV hydrogen compounds.

Figure 2:
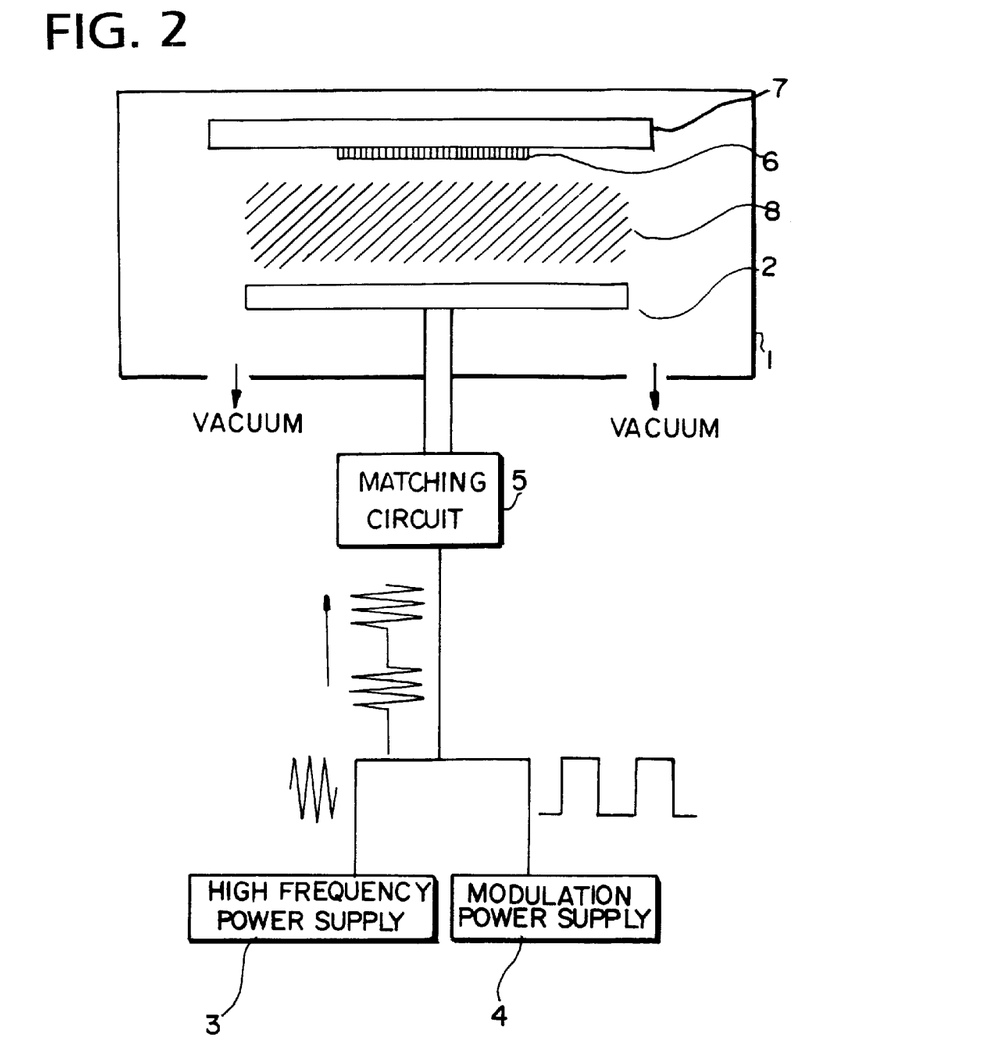
FIG. 2 is a schematic view showing a plasma CVD apparatus used in Examples 1 to 3 of the present invention.

FIG. 2 is a schematic view showing a plasma CVD apparatus used in the present example. This apparatus is a so-called capacitance coupling type plasma CVD apparatus. A cathode electrode 2 in a reaction chamber 1 is connected to a high frequency power supply 3 and a modulation power supply 4 via a matching circuit 5. Plasma 8 is generated in a region between the cathode electrode 2 and an anode electrode 7, on which a substrate 6 is affixed. A crystalline silicon wafer is employed for the substrate 6 for the sake of infrared absorption spectrum evaluation.

In this plasma CVD apparatus, the amount of silane gas (500 sccm) flowing into the reaction chamber 1 is regulated by a flow amount controller (not shown).

Figure 1B:
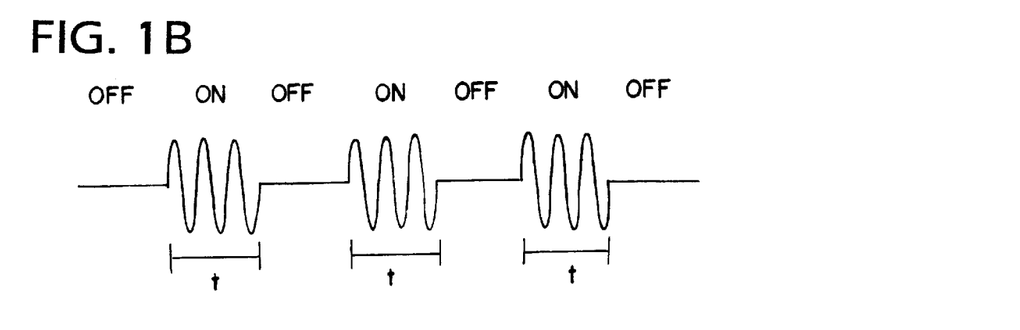
FIG. 1B is a schematic diagram showing a modulated high frequency power according to the present invention obtained by periodically switching on and off high frequency power.

The inlet for introducing the silane gas is also not shown in the figure. The reaction chamber 1 is ventilated at a constant flow rate, thereby maintaining the pressure in the reaction chamber 1 at 0.62 Torr. The oscillation frequency of the high frequency power supply 3 is 27.12 MHz. A low frequency power provided from the modulation power supply 4, which repeats switching on and off at a predetermined period in a d.c. manner, is overlaid on this high frequency power, thereby generating a modulated high frequency power in which a high frequency power of 27.12 MHz is switched on and off at the predetermined period, as shown in FIG. 1B. The modulated high frequency power is supplied to the cathode electrode 2 via the matching circuit 5. As a result, the plasma 8 is generated in the region between the cathode electrode 2 and the anode electrode 7. By thus generating silane plasma between the electrodes 2 and 7, an a-Si:H film is deposited on the substrate 6.

Figure 3:
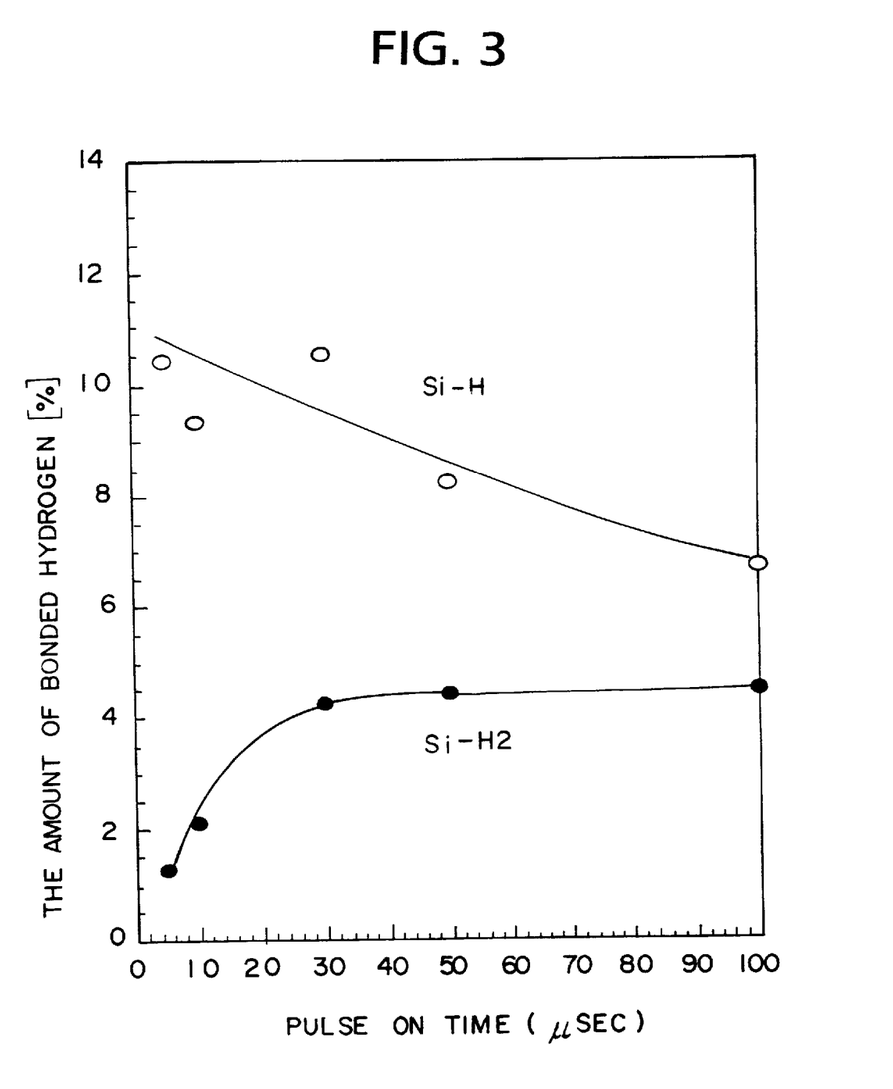
FIG. 3 is a graph showing experimental results of Example 1 of the present invention.

A high frequency power is switched On and off at a predetermined period in a d.c. manner in the present example. However, the high frequency power, which contributes to plasma generation, does not need to be switched completely on and off to effect plasma generation. A milder change occurring at high frequency power at a predetermined period can be adopted, as long as plasma generation is achieved. The substrate temperature is prescribed to be 270° C. in the present example, FIG. 3 shows the amounts (atom. %) of bonded hydrogen in the Si—H bonds and Si—$H_2$ bonds in a-Si: H films obtained in the above-mentioned manner in relation to the ON time in one period of modulated high frequency ranging from 5 μsec to 100 μsec, while fixing the OFF time in one period of the modulated high frequency at 50 μsec; this data was obtained by an infrared absorption spectrum analysis. The power level of the high frequency power was varied from 200 W to 1 kW in such a manner that the film-formation rate was maintained at about 600 angstroms/min. As is clear from FIG. 3, the Si—$H_2$ bonds in the films start decreasing in the vicinity of 50 μsec on the ON-time axis. At 5 μsec, the content ratio of the Si—$H_2$ bonds to the Si—H bonds is as low as about 10%. This data indicates that high-quality films have been formed that have densities and content ratios equivalent to those of films which were formed at the usual rate of about 60 angstroms/min. Thus, films having an excellent photoconductivity/dark conductivity ratio were successfully obtained under a high-rate film formation condition of 600 angstroms/min. The content ratio of Si—$H_2$ bonds to Si—H bonds should not be higher than 20% in order for the resultant film to be applicable to a solar battery.

The ON time value at which the content ratio of Si—$H_2$ bonds to Si—H bonds becomes smaller than 0.5 under the film formation conditions according to the present example is estimated to be 30 μsec or less, which is derived by taking a reciprocal of {(secondary reaction rate constant)×(number of $SiH_4$ molecules)} (this formula resulted from logical deduction by the present inventors). This value coincides well with 50 μsec, at which the films start showing excellence in the present example.

Accordingly, a high-quality a-Si: H film can be obtained at a film formation rate of about 600 angstroms/min, which is one digit faster than conventional methods, by employing the plasma CVD apparatus of the present invention while intermittently supplying energy for plasma generation at a time interval (hereinafter referred to as the "supply time interval") which is equal to or less than a reciprocal of {(secondary reaction rate constant of a source gas reacting with active species other than long-life active species within the plasma)×(number of source gas molecules)}, in accordance with the method of the present invention. The intermittent supply of energy for plasma generation is realized by the switching on and off of the modulation high frequency power as shown in FIG. 1B such that the modulated high frequency power is turned on during a predetermined period t and turned off during the other periods. Substantially no powder was generated in the reaction chamber 1 according to the present example.

Although the OFF time was fixed at 50 μsec in the present example, the OFF time can be any value in the range of 1 μsec to 10000 μsec, and preferably in the range of 10 μsec to 100 μsec. Furthermore, although the ratio of ON time to OFF time is kept constant in the above example, the ratio can be varied within the above-specified range during the film formation.

EXAMPLE 2

Next, Example 2 of the present invention will be described.

In order to further enhance the film formation rate relative to Example 1, the flow amount of monosilane gas is regulated to be twice as large as in Example 1, (i.e., 1000 sccm) according to the present example. The other film formation conditions and the plasma CVD apparatus are the same as in Example 1 unless otherwise specified. In the present example, a film formation rate as high as about 1300 angstroms/min is attained, which is twice as fast as in Example 1.

Figure 4:
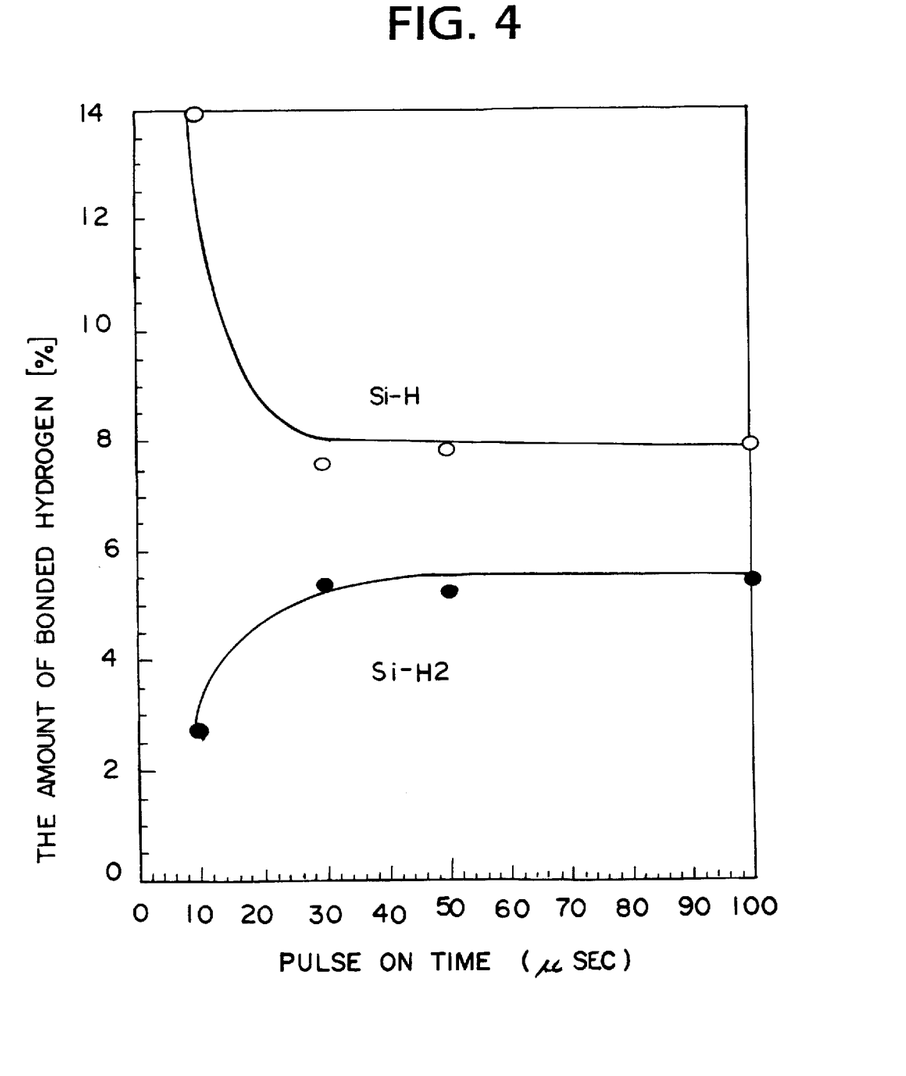
FIG. 4 is a graph showing experimental results of Example 2 of the present invention.

FIG. 4 shows the amounts (atom. %) of bonded hydrogen in the Si—H bonds and Si—$H_2$ bonds in a-Si: H films obtained in the above-mentioned manner in relation to the ON time in one period of modulated high frequency ranging from 10 μsec to 100 μsec, while fixing the OFF time in one period of the modulated high frequency at 50 μsec; this data was also obtained by an infrared absorption spectrum analysis. The power level of the high frequency power was varied from 400 W to 1.5 kW in such a manner that the film-formation rate was maintained at about 1300 angstroms/min. As seen from FIG. 4, the Si—$H_2$ bonds in the films also start decreasing in the vicinity of 50 μsec on the ON-time axis in the present example, thus providing high-quality films.

The ON time value at which the content ratio of Si—$H_2$ bonds to Si—H bonds becomes smaller than 0.5 under the film formation conditions according to the present example is also estimated to be 30 μsec in accordance with the above-mentioned formula because the reaction gas is applied at the same pressure of 0.65 Torr as in Example 1. This value well coincides with 50 μsec, at which the films start showing excellence in the present example.

Although the OFF time was fixed at 50 μsec in the present example, the OFF time can be any value in the range of 1 μsec to 10000 μsec, and preferably in the range of 10 μsec to 100 μsec. Furthermore, although the ratio of ON time to OFF time is kept constant in the above example, the ratio can be varied within the above-specified range during film formation.

EXAMPLE 3

Next, Example 3 of the present invention will be described.

In order to further improve the quality of the resultant film, the frequency of the high frequency power is set at 81.36 MHz in the present example. The other film formation conditions and the plasma CVD apparatus are the same as in Example 1 unless otherwise specified. In the present example, the ratio of photoconductivity to dark conductivity (which is one index defining a high-quality film) can improved to be $1 \times 10^7$ at the same film formation rate, which shows an improvement by one digit relative to a conventional method employing a high frequency power of 13.56 MHz. Alternatively, it is possible to obtain the same deposition rate as that attained by the conventional method by only using ¼ of the high frequency power required by the conventional method, owing to the high frequency (i.e., 81.36 MHz) employed in the present example.

Figure 5:
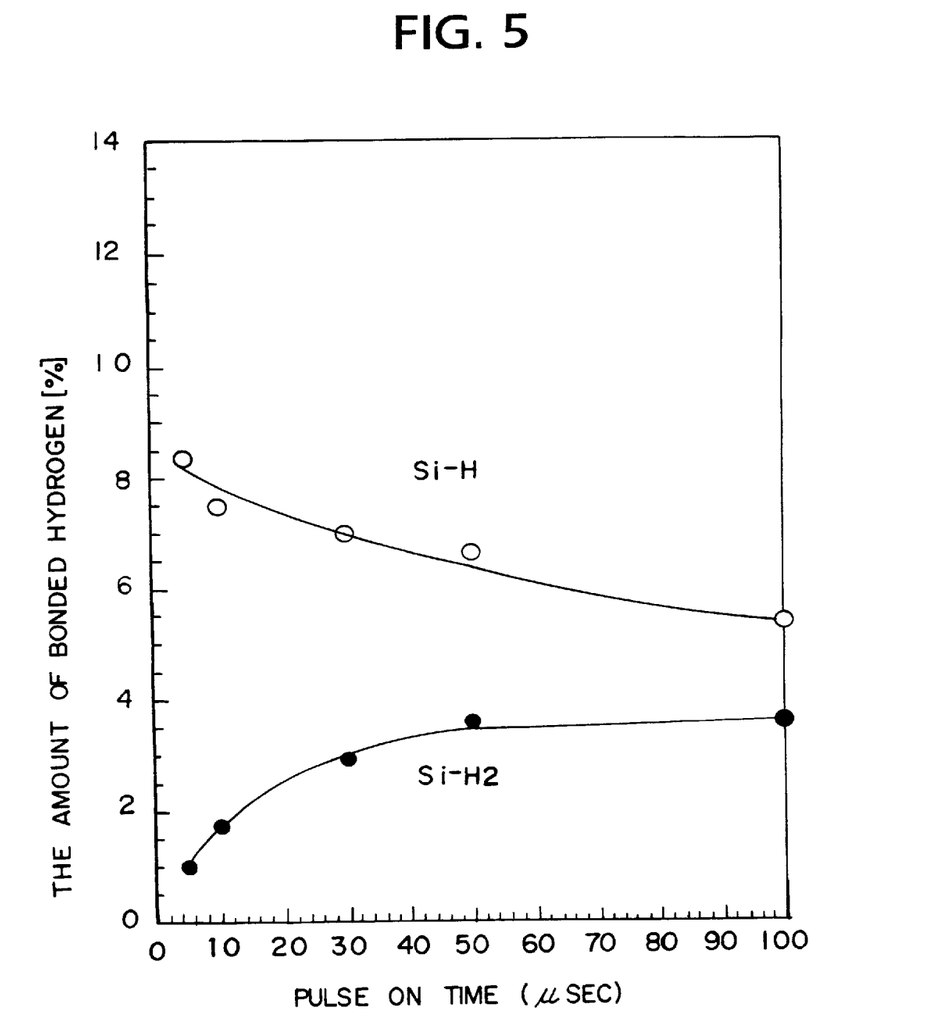
FIG. 5 is a graph showing experimental results of Example 3 of the present invention.

FIG. 5 shows the amounts (atom. %) of bonded hydrogen in the Si—H bonds and Si—$H_2$ bonds in a-Si: H films obtained in the above-mentioned manner in relation to the ON time in one period of modulated high frequency ranging from 10 μsec to 100 μsec, while fixing the OFF time in one period of the modulated high frequency at 50 μsec: this data was also obtained by an infrared absorption spectrum analysis. The power level of the high frequency power was varied from 50 W to 250 W in such a manner that the film-formation rate was maintained at about 600 angstroms/min. As seen from FIG. 5, the Si—$H_2$ bonds in the films also start decreasing in the vicinity of 50 μsec on the ON-time axis in the present example, thus providing high-quality films. The total amount of bonded hydrogen in the Si—H and Si—$H_2$ bonds combined is reduced relative to Examples 1 and 2, which is another advantage provided by the high frequency power of 81.36 MHz.

The inventors confirmed that the above-mentioned improvement attained by the high frequency power of 81.36 MHz (i.e., improvement in the ratio of photoconductivity to dark conductivity by one digit relative to a conventional method employing a high frequency power of 13.56 MHz, and the reduction in the total amount of bonded hydrogen within the film) were also attained at higher frequencies.

The ON time value at which the content ratio of Si—$H_2$ bonds to Si—H bonds becomes smaller than 0.5 under the film formation conditions according to the present example is also estimated to be 30 μsec in accordance with the above-mentioned formula because the reaction gas is applied at the same pressure of 0.65 Torr as in Example 1. This value well coincides with 50 μsec, at which the films start showing excellence in the present example.

Although the OFF time was fixed at 50 μsec in the present example, the OFF time can be any value in the range of 1 μsec to 10000 μsec, and preferably in the range of 10 μsec to 100 μsec. Furthermore, although the ratio of ON time to OFF time is kept constant in the above example, the ratio can be varied within the above-specified range during film formation.

Although the formation of an a-Si: H film (hydrogenated amorphous silicon (a-Si: H) was described in the above examples, the present invention is also effective for improving the film formation rate and the quality of other amorphous silicon type alloy films including a group-IV element (Ge, C) such as an a-SiGe: H film (which has a narrow energy band gap) and an a-SiC: H film (which has a broad energy band gap), which are produced by using a group-IV compound as a material gas.

The thin semiconductor films obtained in the above-described examples are most suitable for photosemiconductor devices such as solar batteries. However, these films can also be applied to semiconductor devices whose operation does not utilize light, e.g., TFT.

According to the present invention, a method for forming a thin semiconductor film is provided in which energy for plasma generation at a supply time interval which is equal to or less then a reciprocal of ((secondary reaction rate constant of a source gas reacting with active species other than long-life active species within the plasma)×(number of source gas molecules)), is intermittently supplied. As a result, the following advantages are provided:

(1) A high-quality thin semiconductor film having excellent photoconductivity and excellent photoconductivity/dark conductivity ratio can be obtained with a high yield even in the case of depositing a thin hydrogenated amorphous silicon film at a high rate, which can be suitably used as a thin semiconductor film for photosemiconductor devices, such as photosensitive drums and various photosensors, as well as TFTs.

(2) It is possible to produce thin semiconductor films with a high throughput, whereby high-performance semiconductor devices can be provided at a low cost.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A plasma CVD apparatus for producing a thin semiconductor film comprising:

a reaction chamber housing a cathode electrode, an anode electrode adapted to hold a substrate to be coated with the semiconductor film, and a plasma between the cathode electrode and the substrate, a high frequency power supply applying high frequency energy to the cathode electrode for generating the plasma; and an intermittent modulation power supply which outputs an intermittent output signal that allows or inhibits the supply of the high frequency energy in a time-divided manner, wherein the intermittent output signal from the modulation power supply is output at a supply time interval of 50 μsec or less and which interval is equal to or less than a reciprocal of (a secondary reaction rate constant of a source gas reacting with active species other than long-life active species within the plasma)×(a number of source gas molecules).

2. A plasma CVD apparatus according to claim 1, wherein the intermittent output signal from the modulation power supply intermittently supplies the energy for plasma generation at a supply time interval of 50 μsec or less, to produce a thin semiconductor film at a rate of at least 600 angstroms per minute.

3. A plasma CVD apparatus according to claim 1, wherein the intermittent output signal intermittently supplies the energy for plasma generation to produce a thin hydrogenated, amorphous silicon type semiconductor film having a content ratio of Si—$H_2$ bonds to Si—H bonds that is smaller than 0.5.

4. A plasma CVD apparatus according to claim 1, wherein the high frequency power supply energy for plasma generation is 27.12 MHz or more.

5. A plasma chemical vapor deposition apparatus comprising:

- a reaction chamber having a cathode electrode, and an anode electrode holding a semiconductor substrate;
- a power supply generating a high frequency energy supply;
- an intermittent modulator generating an intermittent modulation signal combined with the high frequency energy supply to form a modulated energy supply;
- where the source gas forms a plasma in the reaction chamber when the modulated energy supply is applied to the cathode electrode, and
- where the modulated energy supply has an energy level sufficient to maintain the plasma only during cyclical supply time intervals of 50 μsec or less and that are each equal to or less than a reciprocal of (a secondary reaction rate constant of the source gas reacting with active species in the plasma, other than long-life active species)×(a number of source gas molecules supplied to the reaction chamber).

6. A plasma chemical vapor deposition apparatus comprising:

- a reaction chamber containing a cathode electrode, an anode electrode adapted to hold a substrate, and a plasma between the cathode electrode and substrate from a source gas,
- a power source providing an intermittent high frequency power supply applied to the cathode electrode in the chamber to form the plasma, and
- where the high frequency power supply has an energy level sufficient to maintain the plasma only during a cyclical supply time interval 50 μsec or less and that is equal to or less than a reciprocal of (a secondary reaction rate constant of the source gas reacting with active species in the plasma, other than long-life active species)×(a number of source gas molecules supplied to the reaction chamber).

* * * * *